United States Patent
Pajaniradja et al.

(10) Patent No.: US 8,751,553 B2
(45) Date of Patent: Jun. 10, 2014

(54) FILTERING DEVICE WITH A HIERARCHICAL STRUCTURE, AND RECONFIGURABLE FILTERING DEVICE

(75) Inventors: Suresh Pajaniradja, Bourg-la-Reine (FR); Mickael Guibert, Le Perreux-sur-Marne (FR); Renaud Schmit, Auneau (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 564 days.

(21) Appl. No.: 13/062,350

(22) PCT Filed: Aug. 21, 2009

(86) PCT No.: PCT/EP2009/060845
§ 371 (c)(1),
(2), (4) Date: Apr. 12, 2011

(87) PCT Pub. No.: WO2010/026064
PCT Pub. Date: Mar. 11, 2010

(65) Prior Publication Data
US 2011/0208795 A1     Aug. 25, 2011

(30) Foreign Application Priority Data
Sep. 5, 2008 (FR) ............................... 08 04884

(51) Int. Cl.
*G06F 17/10* (2006.01)
(52) U.S. Cl.
USPC ......................................................... 708/300
(58) Field of Classification Search
None
See application file for complete search history.

(56) References Cited

U.S. PATENT DOCUMENTS

| 5,487,023 A | 1/1996 | Seckora |
| 6,963,890 B2* | 11/2005 | Dutta et al. .................. 708/319 |
| 8,041,759 B1* | 10/2011 | Langhammer et al. ........ 708/523 |
| 2002/0184275 A1* | 12/2002 | Dutta et al. .................. 708/300 |
| 2003/0195910 A1* | 10/2003 | Corless et al. ................ 708/322 |
| 2005/0283508 A1 | 12/2005 | Hennedy |
| 2011/0208795 A1* | 8/2011 | Pajaniradja et al. .......... 708/308 |
| 2012/0110051 A1* | 5/2012 | Mathai et al. ................. 708/316 |

FOREIGN PATENT DOCUMENTS

| EP | 0623996 A1 | 11/1994 |
| EP | 1176717 A1 | 1/2002 |

OTHER PUBLICATIONS

Torres L et al.: "A reconfigurable digital filter chip for image processing," ASIC/SOC Conference, 1999. Proceedings. Twelfth Annual IEEE International Washington, DC, USA Sep. 15-18, 1999, Piscataway, NJ, USA, IEEE, US, Sep. 15, 1999, pp. 97-97, XP010360316, ISBN: 978-0-7803-5632-0, abstract, p. 93-94; figures 1-3, p. 95; figure 6, p. 96; figure 8.

\* cited by examiner

*Primary Examiner* — David H Malzahn
(74) *Attorney, Agent, or Firm* — Baker & Hostetler LLP

(57) ABSTRACT

The invention provides a filtering device with hierarchical structure making it possible to carry out finite impulse response and infinite impulse response linear filtering functions and which can be combined with one or more devices of the same type. The device includes at least one first and one second filtering module having means for carrying out filtering functions with N configurable coefficients. A first subset of the N coefficients of a module is configured to carry out nonrecursive filtering functions, a second subset of the coefficients configured to carry out recursive filtering functions, one or more feedback loops able to be activated per module, at least one result sample of the filtering being generated at each clock cycle. The invention also provides a reconfigurable filtering device using at least two filtering devices with the hierarchical structure.

12 Claims, 2 Drawing Sheets

FILTERING DEVICE WITH A HIERARCHICAL STRUCTURE, AND RECONFIGURABLE FILTERING DEVICE

CROSS-REFERENCE TO RELATED APPLICATIONS

This application is a National Stage of International patent application PCT/EP2009/060845, filed on Aug. 21, 2009, which claims priority to foreign French patent application No. FR 08 04884, filed on Sep. 5, 2008, the disclosures of which are incorporated by reference in their entirety.

FIELD OF THE INVENTION

The invention relates to a digital filtering device with reconfigurable hierarchical structure and applies notably to the fields of signal processing, image processing, filtering and telecommunications.

BACKGROUND OF THE INVENTION

Linear filters are much used in image processing, in signal processing and in telecommunications.

In image processing they make it possible to reduce noise, to increase contrast, to smooth, to extract coarse characteristics or else to extract the contours of an image. By way of example, the Sobel and Prewitt operators make it possible to detect the contours of an image. A matrix convolution of the image is performed using a two-dimensional convolution mask, the mask being of size 3×3. This convolution is conducted in the discrete spatial domain and is implemented in practice by virtue of a FIR finite impulse response filter of order 3.

Other more accurate contour detection procedures use IIR infinite impulse response filters. IIR filters are more complex to implement than FIR filters because of their recursive characteristic. Indeed, the output of the filter depends on the input samples but also on the previous results resulting from the filtering. Moreover, the type of data feed must be different so as to present an anti-causal stream as input to the filter. By way of example, the Deriche and Shen filters, much used in image processing, are IIR filters of order 2 and of order 1 respectively. The Deriche filter makes it possible to perform contour detection on a processed image, based on the computation of gradients. The gradient along the abscissa axis is computed using a smoothing filter in the ordinate direction, and then a differentiator filter in the abscissa direction. Each of the two filters decomposes into a causal part and an anti-causal part. Another smoothing filter and another differentiator filter are moreover necessary for computing the gradient along the ordinate axis. Four recursive filters are therefore necessary for carrying out contour detection with this procedure.

It is increasingly common for a signal processing system to have the capacity to carry out several concurrent applications. In the case of an image processing system, the algorithms typically call upon several types of operations to be carried out on the images, notably linear filtering operations. Several types of filters may be computed and combined so as to extract the useful information from the image. A hardware module having a high computational power while allowing a certain flexibility for executing different functions is today particularly useful in an embedded system.

The existing solutions making it possible to carry out linear filtering operations are typically carried out with the aid of processors or dedicated architectures.

In the case of solutions based on embedded processors, it is possible to carry out linear filtering operations with general-purpose processors, with digital signal processors termed DSPs, or else with specific processors of the SIMD type. On account of their programmability, the use of processors allows flexible implementation, but the available computational power remains limited. Indeed, to carry out a filtering of length N, a conventional general-purpose processor typically requires 4×N clock cycles per image pixel to perform a convolution.

A DSP processor is more suited to this kind of operation but requires N/2 cycles per image pixel.

On account of its highly parallel structure, an SIMD processor is particularly suited to the linear convolution but is less so for the production of recursive filters. This is due to the handling of various types of data access (causal and anti-causal) as well as to the dependency, specific to recursive filters, on the previous results. Moreover, this type of computation demands significant precision and a wide computational dynamic range. Embedded SIMD processors are limited as regards these two aspects.

An implementation based on a dedicated architecture makes it possible to optimize the processing times but is not sufficiently flexible. It is difficult in this case to implement both FIR filters and IIR filters on one and the same architecture while optimizing the cost in terms of silicon.

It is apparent that the existing solutions allow either high flexibility of implementation in exchange for low computational performance, or conversely good computational performance in exchange for limited flexibility of use.

SUMMARY OF THE INVENTION

An aim of the invention is notably to alleviate the aforementioned drawbacks.

For this purpose the subject of the invention is a filtering device with hierarchical structure FDHS making it possible to carry out finite impulse response FIR and infinite impulse response IIR linear filtering functions and which can be combined with one or more devices of the same type, said device comprising at least one first and one second filtering module FM comprising means for carrying out filtering functions with N configurable coefficients. A first subset of the N coefficients of a module FM is configured so as to carry out nonrecursive filtering functions, a second subset of said coefficients being able to be configured so as to carry out recursive filtering functions, one or more feedback loops being able to be activated per module FM, at least one result sample of the filtering being generated at each clock cycle. The FDHS device comprises at least a main input port making it possible to transmit to the device a stream of samples to be filtered, said port being connected to the two filtering modules FM, a secondary input port connected to the first filtering module FM making it possible to transmit a second stream of samples to the device, a main output port making it possible to transmit the result of the filtering operations at the output of the device after combination of the streams at the output of each reconfigurable filtering module, a secondary output port making it possible to transmit a result after filtering composed of a stream of samples taken at the output of the second filtering module FM (2), said port being able to be connected to the secondary input port (3) of another digital filtering device.

The stream of samples presented to the secondary input port is, for example, a stream of samples to be processed which is independent of the stream presented to the main input port.

The stream of samples is, for example, a stream originating from another FDHS device, the two devices being connected so as to carry out a filtering function of order greater than N.

The filtering device is configurable in at least three filtering configurations, the first configuration corresponding to a 2D IIR filter of order N/2, the second configuration corresponding to two 2D FIR filters of order N and the third configuration corresponding to a 2D FIR filter of order 2×N.

The values of the filtering coefficients used by each filtering module FM are stored, for example, in programmable registers.

Anti-causal streams of samples are generated, for example, by LIFO circuits, said LIFO circuits being placed at the output of the first filtering module FM and at the input of the second filtering module FM.

The data processed by said FDHS device may be, for example, in integer format, in fixed point format. The filtering device can comprise a synchronization module making it possible to automatically compensate for the differences in latency between the outputs of the two filtering modules.

For example, each filtering module FM used by the device comprises at least N multipliers, N delay cells, two trees of adders, a main input port, a secondary input port, a main output port and a secondary output port.

Each filtering module used by the device comprises, for example, a realignment function upstream of the main output port when the samples to be processed are represented in fixed point format and a compensation function placed upstream of the secondary output port making it possible to balance the latencies introduced by the multipliers and the trees of adders.

The routing of the data streams internally in the device is chosen, for example, with the aid of steering flip-flops.

The subject of the invention is also a reconfigurable filtering device RFD using at least two filtering devices with hierarchical structure FDHS, said device comprising at least four input ports making it possible to present as input to the device one or more streams of samples to be filtered, four output ports making it possible to present as output from the device the stream or streams resulting from the filtering operation or operations carried out by the device, a reconfigurable steering circuit making it possible on the one hand to route the input streams either toward the main input ports or toward the secondary input ports of one or the other of the FDHS devices, and on the other hand to route the results available on the main or secondary output ports of the FDHS devices either as output from the RFD device or toward the main or secondary input ports of another FDHS device.

The advantage of the invention is notably to propose a solution making it possible to implement several types of filters on one and the same architecture, i.e. on the one hand FIR finite impulse response filters and on the other hand IIR infinite impulse response filters. The order and the size of the filters is parametrizable and makes it possible to use the same architecture within the framework of concurrent applications. Another advantage of the invention is that the proposed architecture allows effective and fast execution of the filtering functions even when the size of the filters is significant. It is therefore possible to process, for example, images of significant resolution. The invention is usable within the framework of the implementation of several types of signal processing algorithms while optimizing the cost of implementation and reducing the silicon occupancy of the systems using the invention.

BRIEF DESCRIPTION OF THE DRAWINGS

Other characteristics and advantages of the invention will be apparent with the aid of the description which follows given by way of nonlimiting illustration, offered with regard to the appended drawings among which.

DETAILED DESCRIPTION

Figure 1:
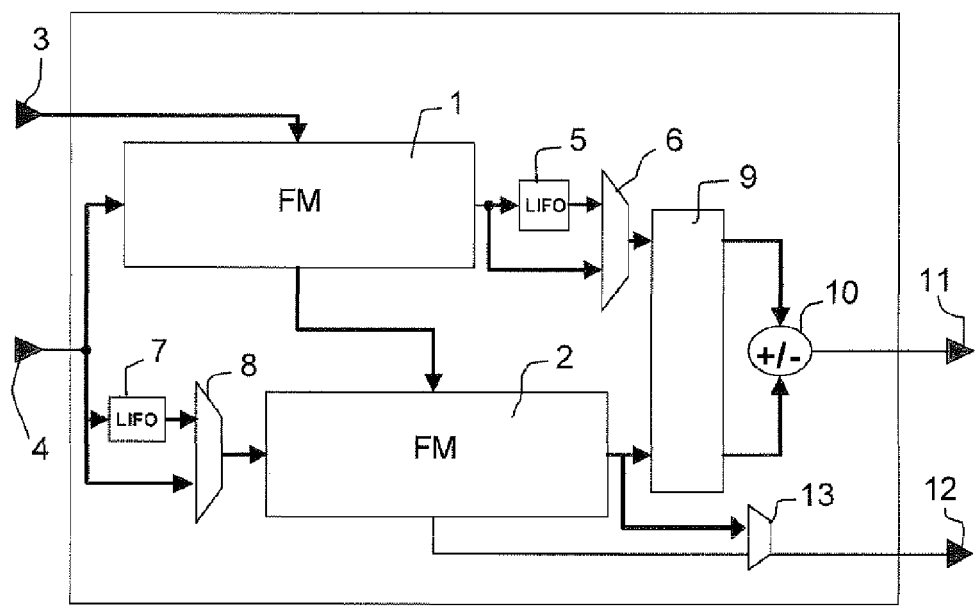
FIG. 1 illustrates an exemplary filtering device with hierarchical structure according to the invention, said device being designated by the acronym FDHS.

FIG. 1 presents an exemplary filtering device with reconfigurable hierarchical structure FDHS according to the invention. In this example, the device is composed of two reconfigurable filtering modules FM with N coefficients 1, 2 representing the computational core of the device. Each of these modules is composed of a hardware circuit making it possible to carry out linear filtering functions with N coefficients. These modules FM may be configured to produce FIR finite impulse response filters or IIR infinite impulse response filters and produce a result sample at each clock cycle. A module FM comprising N coefficients is capable of carrying out the N multiplications and N−1 additions of a recursive or nonrecursive filter, in 1 single clock cycle. The streams of samples arrive at the rate of one sample per clock cycle and the module FM produces a result sample per clock cycle. Thus, the circuit makes it possible to perform filtering computations in a parallel manner and as rapidly as the clock frequency so allows. The same function may be carried out on programmable processors of CPU type but said CPU processors cannot produce a result sample every clock cycle.

The FDHS device moreover comprises two input ports, i.e. a main input port 4 and a secondary input port 3.

The main input port 4 makes it possible to receive the stream of input samples to be filtered, the stream being able to be composed, for example, of the pixels of an image.

The secondary input port 3 may be used in two ways. In a first use, the secondary input port 3 is used to receive a second stream of samples to be processed in parallel with the first, for example a stream of pixels corresponding to a second image to be processed. In a second use, the secondary input port is used to receive partial filtering results when several FDHS devices are used in series.

Furthermore, the FDHS device comprises two output ports, i.e. a main output port 11 and a secondary output port 12.

The main output port 11 transmits as output from the device the result samples of the filtering operations.

The secondary output port 12 may be used in two ways. In a first configuration, the secondary output port 12 is used to transmit the results of the second module FM 2 as output from the device. This secondary port 12 may be used as a second filtering output when the device is configured to produce several filters in parallel. In a second configuration, the secondary output port 12 transmits as output from the device the samples presented to the main input port 4. This configuration is chosen notably when the FDHS device is combined with one or more FDHS devices of the same type.

As explained previously, the FDHS device consists of two modules FM 1, 2 carrying out the filtering operations. Each module FM has the capacity to carry out a filtering of FIR or IIR type as a function of the way in which it has been configured. When the modules are configured to produce IIR filters, LIFO circuits 5, 7, the acronym standing for the expression "Last In First Out", are used and make it possible to create anti-causal data sources. Thus, an FDHS device is capable of carrying out in 1 single pass and simultaneously a causal recursive processing, that is to say a processing whose results depend on the input samples and on the past outputs, but also an anti-causal recursive processing, that is to say a processing whose results depend on the input samples and on the future outputs. The LIFO circuits are storage components making it possible to reverse the order of the samples. By way of example, at the output of the LIFO circuits 5, 7, a stream $e_0$, $e_1, \ldots e_n$ is presented at output in the order $e_n, e_{n-1}, \ldots e_1, e_0$. This reversal is indispensable for recursive processings of Deriche or Shen type, for example. The LIFO circuits are based on memory elements of sufficient capacity to store all the input samples $e_0, e_1, \ldots, e_n$. By way of example, in an application of image processing type, at least one image line may be stored.

A synchronization module 9 makes it possible to automatically compensate for the differences in latency between the outputs of the two modules FM 1, 2 before said outputs are processed by an adder/subtracter 10. The resulting samples are thereafter directed toward the main output port 11. The FDHS device is configurable in the sense that each module FM is itself configurable. Moreover, the routing of the data streams internally in the FDHS device is also configurable by virtue of steering components 6, 8, 13.

The given example of an FDHS device makes it possible to carry out various filtering schemes as a function of the configuration of the interconnections of the device and of the modules FM 1, 2.

If the FDHS device is used within the framework of image processing applications, the device makes it possible to perform a 1D filtering, that is to say line-by-line image processing. A 2D filtering can also be carried out by reinjecting the previous results column by column as input to the FDHS device. Indeed, when the 2D convolution mask is decomposable into two 1D convolution masks, the 2D filtering operation is equivalent to two 1D filtering operations.

The FDHS device may be parametrized to produce at least three filtering configurations in two filtering passes.

A first configuration makes it possible to produce a 2D IIR filter of order N/2. For this purpose, the latter may be configured in the following manner:
  the two modules FM 1, 2 are configured in recursive mode with their feedback loops activated;
  the two LIFO circuits 5, 7 are activated;
  the main input port 4 is used and passes through the first module FM 1 so as to carry out a causal recursive processing, the order of whose samples is reversed by the first LIFO circuit 5 disposed at the output of the first module FM;
  the stream of samples presented to the main input port 4 is reversed by the second LIFO circuit 7 and passes through the second module FM 2 so as to carry out an anti-causal processing;
  the causal and anti-causal processings are synchronized by the synchronization module 9 and combined by the adder/subtracter 10, and then the result samples are directed toward the main output port 11,
  a second computational pass is performed on the result samples arising from the modules FM with appropriate coefficients so as to carry out the 2D IIR function of order m.

A second configuration makes it possible to produce two 2D FIR filters of order N, which implies that two distinct sources may be processed simultaneously by the device. Within the framework of an image processing application, it will therefore be possible for two images to be processed in parallel. For this purpose, the FDHS device is configured in the following manner:
  the two modules FM 1, 2 are configured in nonrecursive mode without feedback loop activated. The first module FM 1 is configured to carry out a processing on the samples presented on its secondary input port, and the second module FM 2 is configured to carry out a processing on the samples presented on its main input port;
  the two LIFO circuits 5, 7 are not activated;
  the two multiplexers 6, 8 are configured so as to bypass the LIFO circuits;
  a stream of samples is presented at the level of the secondary input port 3 and passes through the first module FM 1, said module carrying out the processing corresponding to the first FIR filter;
  the synchronization module 9 is configured to let through only the stream arising from the first module FM 1 via one of its outputs, the second output being forced to 0.
  the adder 10 transmits the unchanged stream of output samples from the first module FM 1 to the main output port 11;
  a stream of input samples presented at the level of the main input port 4 and which is independent of the stream presented at the level of the secondary input port 3 is transmitted to the second module FM 2 to produce the second 2D FIR filter;
  a second pass over the previous results in these modules with appropriate coefficients carries out the 2D FIR function of order N.

A third configuration makes it possible to produce a 2D FIR filter of order 2×N. In this case, a single source may be processed in two filtering passes, but the filtering length is twice as great as in the second configuration. Two 2D FIR filters independent of order N are produced when the FDHS device is configured in the following manner:
  the two modules FM 1, 2 are configured in cascade in nonrecursive mode without activating a feedback loop;
  the first module FM 1 is configured to carry out a processing on the samples presented on its main input port;
  the second module FM 2 is configured to carry out a processing on the samples presented to its secondary input port;
  the secondary output of first module FM 1 is activated and is linked to the secondary input of the second module FM 2;
  the LIFO circuits 5, 7 are not activated;
  the multiplexers 6, 8 are configured in such a way that the samples bypass the LIFO circuits;
  the samples of the source to be filtered are presented to the main input port 4, the samples thereafter pass through the first module FM 1 and then through the second module FM 2 so as to carry out the FIR filtering processing of order 2N;
  the stream of result samples exits the second module FM 2, passes through the multiplexer 13 and is then presented to the secondary output port 12;
  a second pass of the previous results reinjected into the port 4 in these modules with appropriate coefficients of FM 1 and FM 2 carries out the 2D FIR function of order 2N.

By combining the use of several FDHS devices, it is possible to produce filters of length greater than 2×N.

Figure 2:
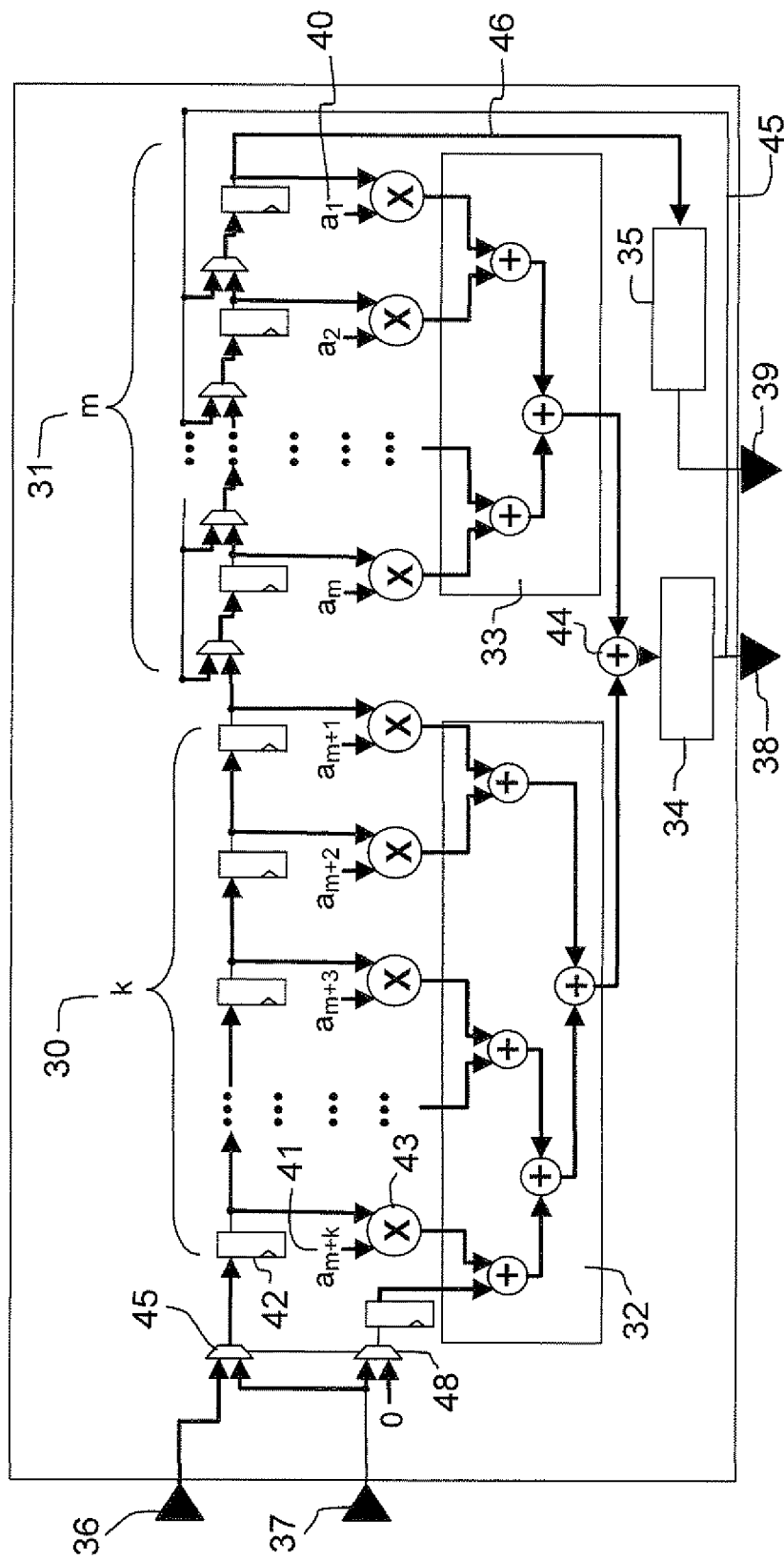
FIG. 2 presents an exemplary reconfigurable filtering module with N coefficients used by the filtering device with hierarchical structure FDHS, said module being designated by the acronym FM.

FIG. 2 presents an exemplary reconfigurable filtering module FM that can be used by the FDHS device such as illustrated by FIG. 1. This module makes it possible to carry out filtering functions with N coefficients $a_1$ 40 to $a_N$ 41. Out of these N coefficients, k are nonrecursive 30 and m are recursive 31 and N=m+k. The module therefore makes it possible to carry out FIR filtering functions of order N or else IIR filtering functions of order m. It is possible to configure a return loop very accurately by choosing the values of the coefficients $a_1$ to $a_m$. It is also possible to activate several return loops on various coefficients $a_1$ to $a_m$.

A module FM comprises two input ports, i.e. a main input port 36 and a secondary input port 37. It furthermore comprises two output ports, i.e. a main output port 38 and a secondary output port 39.

The samples to be filtered are presented to the main input port 36 of the module FM. At each clock cycle, a result sample is available at the level of the main output port 38. The module FM is composed of banks of shift registers 42 and of N multiplier circuits 43 making it possible to weight the delayed samples by the coefficients of the filter. The values of said coefficients are stored in programmable registers.

The intermediate results obtained after application of the delays and weighting of the input samples are added together using trees of adders 32, 33 respectively for the nonrecursive part 30 and the recursive part 31 of the filter. The result of the output from the two trees is thereafter added together 44 and processed by a realignment function 34 in the case where the module processes data in fixed point format.

The implementation of the multipliers 43 and adders 32, 33 is carried out, for example, with combinatorial circuits comprising "pipeline" stages so as to increase the clock rate.

A return loop 45 makes it possible to reinject the results of the filtering as input to the recursive part 31 of the filter. This return pathway is used only when the module is configured so as to carry out an IIR filtering. The feedback loop is reconfigurable, thereby making it possible to adjust the depth of the recursive part 31 of the filter. As explained previously, the values of the coefficients of the filter are programmable. They can therefore be chosen as a function of the targeted application.

It is also possible to increase the order of the filter to be produced by using two modules FM connected together. If it is possible to carry out an FIR filtering function of order N with one module, it is also possible, for example, to carry out an FIR filtering function of order 2×N by using two modules FM. The module therefore comprises a main input-output pair 36, 38 and a secondary input-output pair 37, 39 which is used when several modules FM are combined, as is the case for the FDHS device of FIG. 1. The latencies of the multipliers and of the trees of adders are balanced by a compensation function 35 taking as input the output 46 of the recursive part 31 of the filter. The result after compensation is presented to the secondary output port 39 of the first module FM so as to be reinjected at the level of the secondary input port 37 of the second module FM.

In the case where the module FM is configured to produce an FIR filter, the function carried out is the following:

$$F_{FIR}(e_i) = \sum_{j=1}^{N} a_j \times e_{i-j} \tag{1}$$

where the input samples to be filtered are denoted by $e_i$, and the coefficients of the FIR filter are denoted by $a_j$.

This function makes it possible by configuring the coefficients to execute a 1D filter. If the target application requires the implementation of a 2D filter, the coefficients will be readjusted and the results of the first filtering will be reinjected at the level of the main input port 36 of the module.

In the case where the module is configured to produce an IIR filter, the function carried out is the following:

$$F_{IIR}(e_i) = \sum_{j=1}^{k} a_{m+j} \times e_{i-j} + \sum_{j=1}^{m} a_{m-j+1} \times F_{IIR}(e_{i-j}) \tag{2}$$

the input samples to be filtered being denoted by $e_i$, the first m coefficients $a_i$ of the IIR filter corresponding to the recursive part of the filter and the next k coefficients to the nonrecursive part.

Figure 3:
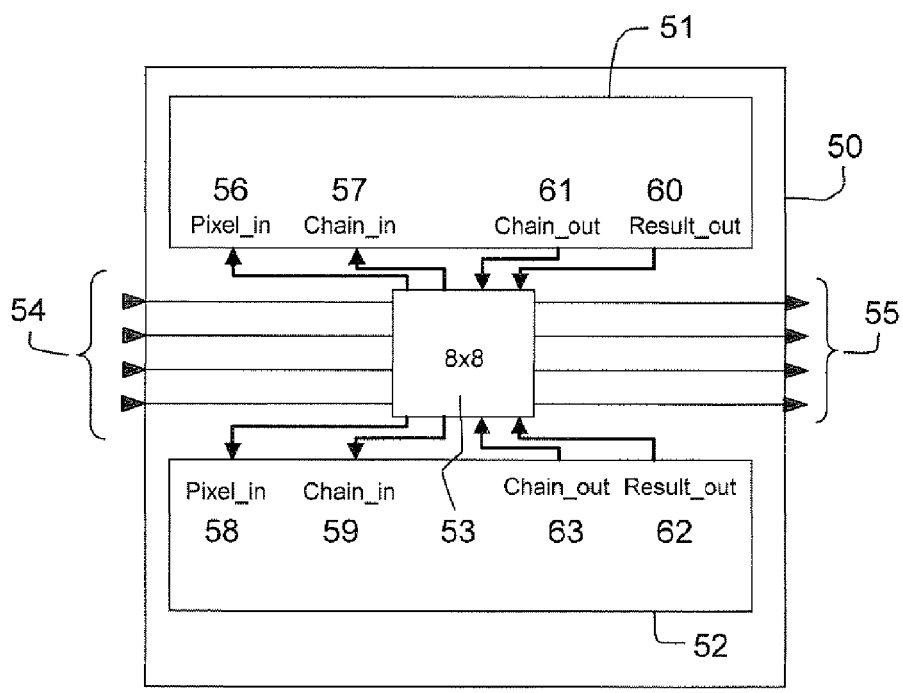
FIG. 3 illustrates an exemplary reconfigurable filtering device using several FDHS devices, said device being designated by the acronym RFD.

FIG. 3 presents an exemplary reconfigurable filtering device RFD 50. Two FDHS devices 51, 52 are used as basic reconfigurable elements. Combining these elements makes it possible to increase the size of the filter to be produced or else to carry out several distinct filtering functions simultaneously.

This RFD device makes it possible to process notably data in integer format, in fixed point format or in floating point format. The size and the format of the data to be processed is dependent on the choice of implementation. The device can therefore process, for example, data of wide dynamic range originating from a video sensor.

The two digital filtering devices with hierarchical structure 51, 52 are connected together by virtue of a steering module 8×8 53. This module 53 is reconfigurable and makes it possible to route the streams presented to the input ports of the device 54, the intermediate results of the FDHS devices and the outputs 55. The input streams 54 are directed either to the main input ports 56, 58 or to the secondary input ports 57, 59 of one 51 or the other 52 of the FDHS devices. The results available on the main 60, 62 or secondary 61, 63 output ports are routed either as output from the RFD device 55 or toward the main or secondary input ports of the other FDHS device. This second option makes it possible to increase the size of the filtering function to be carried out.

The steering module 53 is programmable and allows flexible use of the computation resources 51, 52. It should be noted that the more flexible the steering module 53, that is to say it may be programmed in numerous different ways, the higher its cost in terms of silicon area. An 8×8 steering module, also called an "8×8 switch", makes it possible to handle eight inputs and eight outputs. Thus the input streams, the output streams and the intermediate results of the FDHS are routed as a function of the desired use of the device. The steering module may be implemented, notably, using a "crossbar" circuit offering a large maximum. It is also possible to synthesize an 8×8 switch from, for example, several 2×2 switches.

The exemplary RFD device according to the invention illustrated by FIG. 3 may be used notably in an embedded image processing system requiring high computational power. It was stressed previously that the steering module 53 allows flexible use of the device. The device is capable of executing up to four linear filters of size N simultaneously. But it may also be configured to produce two filters of length 2×N or else one filter of length 4×N. Thus, this device is effective notably within the framework of stereoscopic video systems since two independent images may be processed X-wise and Y-wise simultaneously with two filters allocated to each of the images.

An RFD module comprises for example 4 inputs and 4 outputs for sample streams, the input streams being able to be routed toward the 2 main input ports and the 2 secondary input ports of the FDHS devices included in the RFD device. The RFD device can thus be configured as 4 independent recursive filters processing 4 independent streams of samples simultaneously. Indeed the modules FM included in the FDHS devices comprise means for carrying out the recursive filter function on the basis of a sample stream, that is to say a weighted sum with feedback result. As an FDHS module 51, 52 possesses 2 inputs and 2 outputs which are independent, it is possible to produce 2 independent recursive filters. Thus by combining 2 FDHS modules, an RFD module makes it possible to configure 4 independent and simultaneously-executing recursive filters, the processing speed for each output being one sample per clock cycle.

A device of RFD type is reconfigurable but is not microprogrammed. Stated otherwise, it is not dependent on a microcode. An external device such as a CPU processor can initially configure the 8×8 switch 53, FDHS 51, 52 and FM modules, the steering as well as the multiplicative constants of the FM modules through a simple configuration interface. Once configuration has been terminated the execution of the filters is autonomous and automatic. The circuit reacts solely to the flow of input data. It is the input streams which trigger the filtering computation and not an external CPU.

The invention claimed is:

1. A filtering device having a hierarchical structure and carrying out finite impulse response linear filtering functions and infinite impulse response linear filtering functions, and which is configured to be combined with one or more devices of the same type, said filtering device comprising:
   at least one first filtering module and at least one second filtering module, each comprising means for carrying out filtering functions with N configurable coefficients, wherein a first subset of the N configurable coefficients is configured to carry out nonrecursive filtering functions, and a second subset of said N configurable coefficients is configured to carry out recursive filtering functions;
   one or more feedback loops configured to be activated per filtering module, said filtering device being configured to output samples from a first filtering module to an input of a second filtering module and to an output port of the filtering device, wherein the filtering device is configured to generate at least one result sample at each clock cycle;
   a main input port configured to transmit, to the filtering device, a first stream of samples to be filtered, said main input port being connected to the at least one first filtering module and the at least one second filtering module;
   a secondary input port connected to the at least one first filtering module and configured to transmit a second stream of samples to the filtering device;
   a main output port configured to transmit the at least one result sample at an output of the filtering device after combination of the first stream and the second stream at an output of each filtering module;
   a secondary output port configured to transmit a result sample comprising a stream of samples taken at the output of the second filtering module, said secondary output port configured to be connected to the secondary input port of another filtering device; and
   last in first out circuits placed at an output of the at least one first filtering module and at an input of the second filtering module, wherein anti-causal streams of samples are generated by last in first out circuits.

2. The filtering device as claimed in claim 1, wherein the stream of samples transmitted to the secondary input port of the other filtering device is a stream of samples to be processed and is independent of the stream transmitted to the main input port.

3. The filtering device as claimed in claim 1, wherein the first stream of samples is a stream originating from the other filtering device, the two filtering devices being connected to execute a filtering function of order greater than N.

4. The filtering device as claimed in claim 1, wherein values of the N configurable coefficients used by each of the at least one first filtering module and the at least one second filtering module are stored in programmable registers.

5. The filtering device as claimed in claim 1, further comprising a synchronization module configured to automatically compensate for differences in latency between outputs of the at least one first filtering module and the at least one second filtering module.

6. The filtering device as claimed in claim 1, wherein each filtering module used by the filtering device comprises at least N multipliers, N delay cells, two trees of adders, a main input port, a secondary input port, a main output port, and a secondary output port.

7. The filtering device as claimed in claim 6, wherein each filtering module used by the filtering device comprises a realignment function upstream of the main output port when the samples to be filtered are represented in fixed point format and a compensation function placed upstream of the secondary output port to balance latencies introduced by the N multipliers and the two trees of adders.

8. The filtering device as claimed in claim 1, wherein routing of the streams internally in the filtering device is performed using steering flip-flops.

9. The filtering device as claimed in claim 1, wherein the filtering device is configurable as an infinite impulse response filter of order N/2, and wherein said infinite impulse response filter is obtained by:
   the first filtering module and the second filtering module that are configured in recursive mode with the one or more feedback loops activated;
   two last in first out circuits that are placed respectively at the output of the first filtering module and at the input of the second filtering module are activated;
   the main input port is used and passes through the first filtering module to carry out a causal recursive processing, the order of samples of the causal recursive processing being reversed by the first last in first out circuit disposed at the output of the first filtering module;
   the stream of samples presented to the main input port is reversed by the second last in first out circuit and passes through the second filtering module to execute an anti-causal processing;
   the causal processing and the anti-causal processing are synchronized by a synchronization module and combined by an adder/subtracter, and resulting samples are directed toward the main output port; and
   a second computational pass is performed on the resulting samples arising from the first filtering module and the second filtering module using configurable coefficients to execute the infinite impulse response function of order m.

10. The filtering device as claimed in claim 1, configurable as two finite impulse response filters of order N, and wherein said finite impulse response filters filter is obtained by:
   the first filtering module and the second filtering module that are configured in nonrecursive mode without the one or more feedback loops being activated;
   a stream of samples that is transmitted to the secondary input port and passes through the first filtering module, said first filtering module executing processing corresponding to the first finite impulse response filter;
a synchronization module that is configured to let through only the stream arising from the first filtering module via one of its outputs, the second output being forced to 0;
an adder that transmits the unchanged stream of output samples from the first filtering module to the main output port;
a stream of input samples that is transmitted to the main input port, the stream of input samples being independent of the stream transmitted to the secondary input port that is transmitted to the second filtering module to produce the second finite impulse response filter; and
a second iteration over the results in the at least one first filtering module and the at least one second filtering module using configurable coefficients to execute the finite impulse response function of order N.

11. The filtering device as claimed in claim 1, configurable as a finite impulse response filter of order 2×N, and wherein said filter is obtained by:
the two modules that are configured in nonrecursive mode without the one or more feedback loop activated;
the first filtering module that is configured to execute a processing on the samples transmitted to the secondary input port, and the second filtering module being configured to execute processing on the samples transmitted to the main input port;
two last in first out circuits that are not activated;
two multiplexers that are configured to bypass the last in first out circuits;
a stream of samples that is transmitted to the secondary input port and passes through the first filtering module, said first filtering module executing the processing corresponding to the first finite impulse response filter;
a synchronization module that is configured to let through only the stream arising from the first filtering module via one of its outputs, the second output being forced to 0;
an adder that transmits the unchanged stream of output samples from the first filtering module to the main output port;
a stream of input samples that is transmitted to the main input port, the stream of input samples being independent of the stream transmitted to the secondary input port that is transmitted to the second filtering module to produce the second finite impulse response filter; and
a second iteration over the results in the at least one first filtering module and the at least one second filtering module using configurable coefficients to execute the finite impulse response function of order N.

12. A reconfigurable filtering device using at least two of the filtering device having a hierarchical structure as claimed in claim 1, said reconfigurable filtering device comprising:
four input ports to receive, as an input to the reconfigurable filtering device, one or more streams of samples to be filtered;
four output ports to transmit, as an output from the reconfigurable filtering device, one or more streams resulting from a filtering operation executed by the reconfigurable filtering device; and
a reconfigurable steering circuit configured to route the input streams either toward the main input ports or toward the secondary input ports of one or the other of the filtering devices, and to route the resulting streams available on the main output ports or the secondary output ports of the filtering devices either as output from the reconfigurable filtering device or toward the main input ports or the secondary input ports of the other filtering device.

* * * * *